United States Patent
Outram et al.

(10) Patent No.: US 10,686,302 B2
(45) Date of Patent: Jun. 16, 2020

(54) RELATING TO POWER SEMICONDUCTOR MODULES

(71) Applicant: General Electric Technology GmbH, Baden (CH)

(72) Inventors: John Lewis Outram, Stone (GB); Stephen David Butler, Essington (GB)

(73) Assignee: General Electric Technology GmbH, Baden (CH)

( * ) Notice: Subject to any disclaimer, the term of this patent is extended or adjusted under 35 U.S.C. 154(b) by 0 days.

(21) Appl. No.: 15/781,000

(22) PCT Filed: Nov. 22, 2016

(86) PCT No.: PCT/EP2016/078470
§ 371 (c)(1),
(2) Date: Jun. 1, 2018

(87) PCT Pub. No.: WO2017/093082
PCT Pub. Date: Jun. 8, 2017

(65) Prior Publication Data
US 2018/0358792 A1 Dec. 13, 2018

(30) Foreign Application Priority Data
Dec. 3, 2015 (GB) .................................. 1521335.8

(51) Int. Cl.
*H02B 13/025* (2006.01)
*H02B 1/56* (2006.01)
(Continued)

(52) U.S. Cl.
CPC ........... *H02B 13/025* (2013.01); *H01H 9/342* (2013.01); *H01L 23/051* (2013.01); *H02B 1/565* (2013.01);
(Continued)

(58) Field of Classification Search
CPC ...... H02B 13/025; H02B 1/565; H01H 9/342; H01H 2009/343; H01L 23/051; H05K 5/0213
See application file for complete search history.

(56) References Cited

U.S. PATENT DOCUMENTS 5,767,440 A   6/1998   Byron et al.
5,892,195 A   4/1999   Aufermann et al.
(Continued)

OTHER PUBLICATIONS

Combined Search and Examination Report issued in connection with corresponding GB Application No. 1521335.8 dated Mar. 2, 2016.
(Continued)

*Primary Examiner* — Dimary S Lopez Cruz
(74) *Attorney, Agent, or Firm* — Eversheds Sutherland (US) LLP

(57) ABSTRACT

A power semiconductor module including a housing within which lies at least one semiconductor switching element. The housing includes a vent aperture that is selectively openable and closeable by a cooperating vent cover. The vent cover is held in an open position during normal operation of the power semiconductor module to open the vent aperture and provide ventilation for the or each semiconductor switching element within the housing. The vent cover is urged into a closed position by an increase in pressure within the housing resulting from an explosive event inside the housing to close the vent aperture and inhibit the escape of explosion gases and/or debris from the housing via the vent aperture

10 Claims, 3 Drawing Sheets

(51) Int. Cl.
*H01L 23/051* (2006.01)
*H01H 9/34* (2006.01)
*H05K 5/02* (2006.01)

(52) U.S. Cl.
CPC ..... *H05K 5/0213* (2013.01); *H01H 2009/343* (2013.01)

(56) References Cited

U.S. PATENT DOCUMENTS

| | | |
|---|---|---|
| 6,295,205 B1 | 9/2001 | Lang et al. |
| 6,342,004 B1 | 1/2002 | Lattimore et al. |
| 6,407,331 B1 | 6/2002 | Smith et al. |
| 7,952,857 B1 | 5/2011 | Motley et al. |
| 8,183,674 B2 | 5/2012 | Billmann et al. |
| 8,492,662 B2 * | 7/2013 | Ballard ................ H01F 27/025 174/522 |
| 2012/0028559 A1 | 2/2012 | Kingston |
| 2013/0306342 A1 | 11/2013 | Karandikar et al. |
| 2014/0133071 A1 | 5/2014 | Gingrich |

OTHER PUBLICATIONS

International Search Report and Written Opinion issued in connection with corresponding PCT Application No. PCT/EP2016/078470 dated Mar. 1, 2017.

* cited by examiner

RELATING TO POWER SEMICONDUCTOR MODULES

FIELD OF THE INVENTION

This invention relates to a power semiconductor module.

BACKGROUND OF THE INVENTION

In power transmission networks alternating current (AC) power is typically converted to direct current (DC) power for transmission via overhead lines and/or under-sea cables. This conversion removes the need to compensate for the AC capacitive load effects imposed by the transmission line or cable and reduces the cost per kilometre of the lines and/or cables, and thus becomes cost-effective when power needs to be transmitted over a long distance.

HVDC converters are used to convert between AC power and DC power and such converters are one example of an electrical equipment item that incorporates one or more power semiconductor modules, although other electrical equipment items may also do so. Typically such power semiconductor modules include one or more semiconductor switching elements, e.g. in the form of Insulated Gate Bipolar Transistors (IGBTs) or chain-link sub-modules, and in HVDC converters they are a key component as the semiconductor switching elements therein act as controlled rectifiers to convert AC power to DC power and vice versa.

SUMMARY

According to an aspect of embodiments of the invention there is provided a power semiconductor module comprising:
 a housing within which lies at least one semiconductor switching element, the housing including a vent aperture selectively openable and closeable by a cooperating vent cover,
 the vent cover being held in an open position during normal operation of the power semiconductor module to open the vent aperture and provide ventilation for the or each semiconductor switching element within the housing, and
 the vent cover being urged into a closed position by an increase in pressure within the housing resulting from an explosive event inside the housing to close the vent aperture and inhibit the escape of explosion gases and/or debris from the housing via the vent aperture.

Having a vent cover which is normally held in an open position so that the vent aperture is open to provide ventilation for the or each semiconductor switching element within the housing allows for a maximum degree of unfettered air-cooling of the or each said internal semiconductor switching element for the vast majority of the time, i.e. during routine operation of the power semiconductor module.

Meanwhile, the option of having the vent cover urged into a closed position, as a result of an explosive event within the housing, to close the vent aperture and thereby substantially prevent explosion gasses, e.g. plasma, and/or explosion debris such as semiconductor switching element fragments, from escaping via the vent aperture contains such materials should such a catastrophic event occur.

In addition, closing the vent aperture also provides the opportunity to direct the resulting explosion gasses and debris through other quenching, e.g. mesh-covered, vents, which ordinarily limit the amount of adequate ventilation available, but nevertheless have the potential to reduce the temperature of the gasses or permanently retain the debris. Alternatively, closing the vent aperture may provide the option of directing the resulting materials in preferred egress directions that are established to minimise the risk of flashovers consequently occurring or nearby personnel being injured.

Preferably the vent cover is configured to return to its open position once the increase in pressure has subsided.

Such a feature provides for only temporarily closing of the vent aperture in the event of an explosive event, but thereafter re-opens the vent aperture to resume ventilation of the or each semiconductor switching element, e.g. should some form of continued operation of the power semiconductor module be possible.

Optionally the vent cover is held in its open position by one of: a biasing member; and gravity.

Both of the aforementioned options for holding the vent cover in its open position have no moving parts and so are able to operate reliably and continually with little or no on-going maintenance required.

Meanwhile, when calibrated correctly their influence in holding the vent cover in its open position can, temporarily, be overcome so as to permit the selective closing of the vent aperture.

The vent cover may be configured to remain in its closed position once the increase in pressure has subsided.

Such permanent closing, e.g. until some remedial action by a maintenance engineer, can usefully help prevent explosion debris dropping out of the housing after the explosive event.

In an embodiment of the invention the vent cover is held in its open position by one or more of:
 a single-use support member; and
 a double-acting support member.

Preferably at least one of the single-use support members is one of:
 a collapsible member;
 a frangible member;
 a friable member; and
 a pair of mutually cooperable members selectively moveable relative to one another.

Each of the aforementioned options reliably retains the vent cover in its open position as needed, while suitably allowing the vent cover to remain in its closed position after an explosive event by having no further effect on the vent cover.

Optionally the or each double-acting support member is a bistable biasing member.

Such an arrangement reliably retains the vent cover in its open position as needed while positively urging the vent cover into its closed position after an explosive event.

In another embodiment of the invention each of the vent aperture and the vent cover includes a plurality of individual ventilation openings, the ventilation openings in the vent cover being coincident with the ventilation openings in the vent aperture when the vent cover is in its open position to define a plurality of ventilation paths, and the ventilation openings in the vent cover being displaced from the ventilation openings in the vent aperture when the vent cover is in its closed position to occlude the said ventilation openings in the vent aperture.

The provision of a plurality of individual ventilation openings in each of the vent aperture and the vent cover creates a safety barrier, e.g. to the ingress of operator fingers, while still providing good ventilation during normal use of the power semiconductor module, i.e. while the vent cover is in its open position. Nevertheless when needed, i.e. in the event of an explosion, the vent aperture can still be closed off to help prevent the escape of explosion gasses and debris.

In a further embodiment of the invention at least one of the vent aperture and the vent cover includes a respective receiving portion corresponding to the or each support member which during normal operation of the power semiconductor module holds the vent cover in its open position, the or each receiving portion receiving and housing a corresponding said support member when the vent cover is in its closed position.

Such an arrangement helps to accommodate any such support members while at the same time helping to ensure the vent aperture is completely closed off when the vent cover is in its closed position.

BRIEF DESCRIPTION OF THE DRAWINGS

There now follows a brief description of embodiments of the invention, by way of non-limiting example, with reference being made to the accompanying drawings in which.

DETAILED DESCRIPTION

Figure 1:
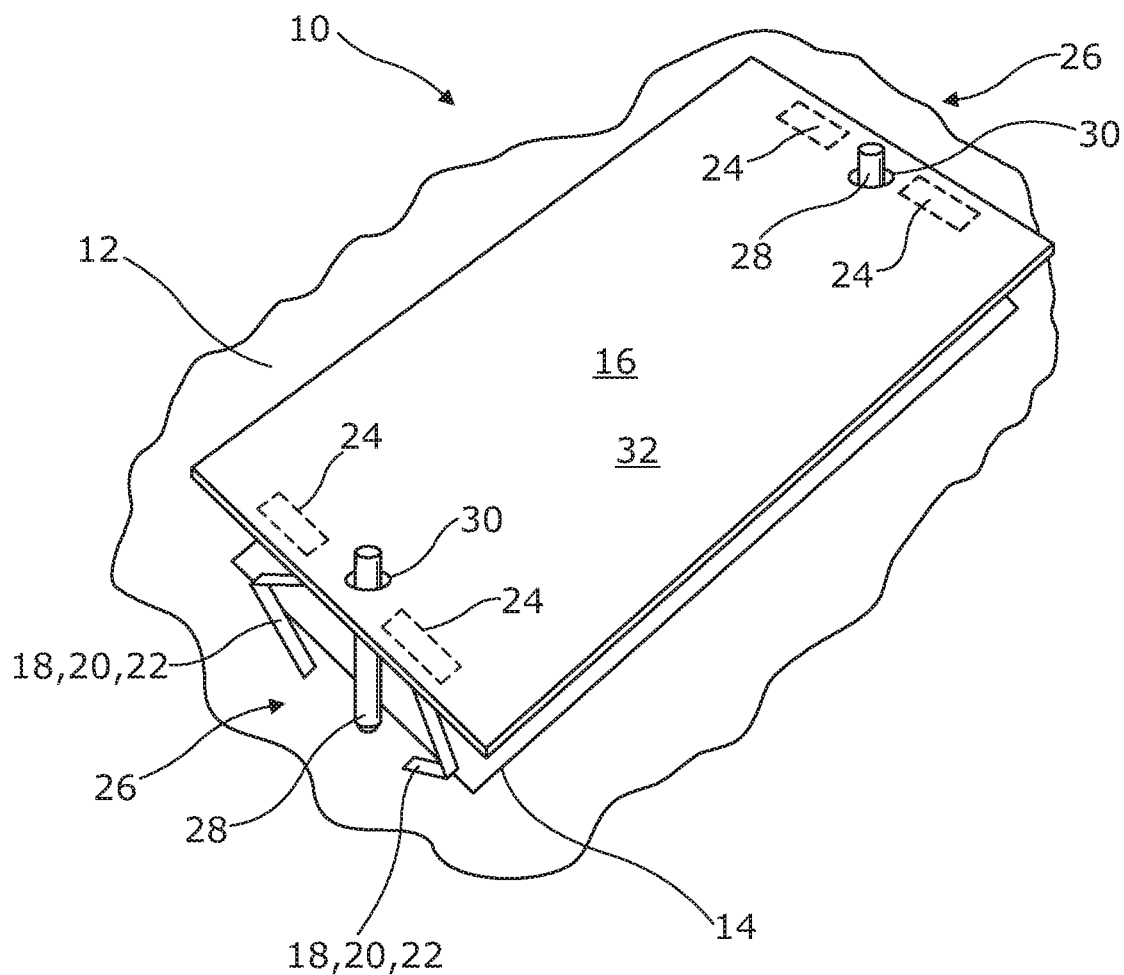
FIG. 1 shows a perspective view of an interior portion of a power semiconductor module.

A power semiconductor module according to embodiments of the invention is designated generally by reference numeral 10, an interior portion of which is shown in FIG. 1.

The power semiconductor module 10 includes a housing 12 within which lies a semiconductor switching element (not shown) together with its associated switching circuitry. In this first embodiment, the semiconductor switching element is a single Insulated Gate Bipolar Transistor (IGBT).

However, in other embodiments of the invention the semiconductor switching element may: be another type of semiconductor switch; include a plurality of series-connected semiconductor switches; or include one or more series-connected chain-link sub-modules.

Such chain-link sub-modules may include a plurality of semiconductor switches, e.g. IGBTs that are connected in parallel with an energy storage device in the form of a capacitor in either a known half-bridge or full-bridge arrangement. In either such case each chain-link sub-module can provide a variable voltage source, i.e. a zero voltage and at least a positive voltage, and can conduct current in two directions.

Returning to the embodiment shown in FIG. 1, the housing 12 includes a vent aperture 14 that is selectively openable and closeable by a cooperating vent cover 16 which, in the embodiment shown, also lies within the housing 12.

The vent cover 16 takes the form of a single, planar member which is larger than the vent aperture 14 over which, in use, it lies. Other forms of vent cover are, however, also possible.

The vent cover 16 is held in an open position, i.e. as shown in FIG. 1, by four single-use support members 18, each of which is a collapsible member 20 in the form of a collapsible leg 22. Fewer than or more than four such single-use support members may be used, as well as other types of single-use support members, such as frangible or friable members.

The vent cover 16 includes four corresponding receiving portions 24 on the underside thereof, each of which receives and houses a corresponding one of the collapsible legs 22 when the vent cover 16 is in a closed position (not shown) in which it closes the vent aperture 14.

A gasket or other seal (not shown) may be provided at the interface between the vent aperture 14 and the vent cover 16 to create a fluid-tight seal when the vent cover 16 is in its closed position.

Movement of the vent cover 16 between the aforementioned open and closed positions is guided by a pair of guide members 26 in the form of upright guide pins 28 which extend from the housing 12 and cooperate with complementary guide openings 30 in the vent cover 16. Other forms of guidance and/or different numbers of guide members are also possible.

In use, and during normal operation of the first power semiconductor module 10, the collapsible legs 22 hold the vent cover 16 in its open position, as shown in FIG. 1. This opens the vent aperture 14 and provides ventilation to cool the semiconductor switching element, i.e. the IGBT.

If an explosive event, e.g. the disintegration of the IGBT, occurs inside the housing 12 the resulting increase in pressure acts upon an inward facing side 32 of the vent cover 16 creating a force that causes the legs 22 to collapse and so they are no longer able to hold the vent cover 16 in its open position. With the internal pressure exceeding the external pressure a net force upon the said inward facing side 32 of the vent cover 16 acts to urge the vent cover 16 downwards into its closed position to thereby close the vent aperture 14 and inhibit the escape of explosion gasses and debris from the housing via the vent aperture 14.

The plastic deformation of the collapsible legs 22 ensures that the vent cover 16 remains in its closed position after the explosion, e.g. until such time as a maintenance engineer moves it into its open position and installs replacement collapsible legs 22.

Figure 2:
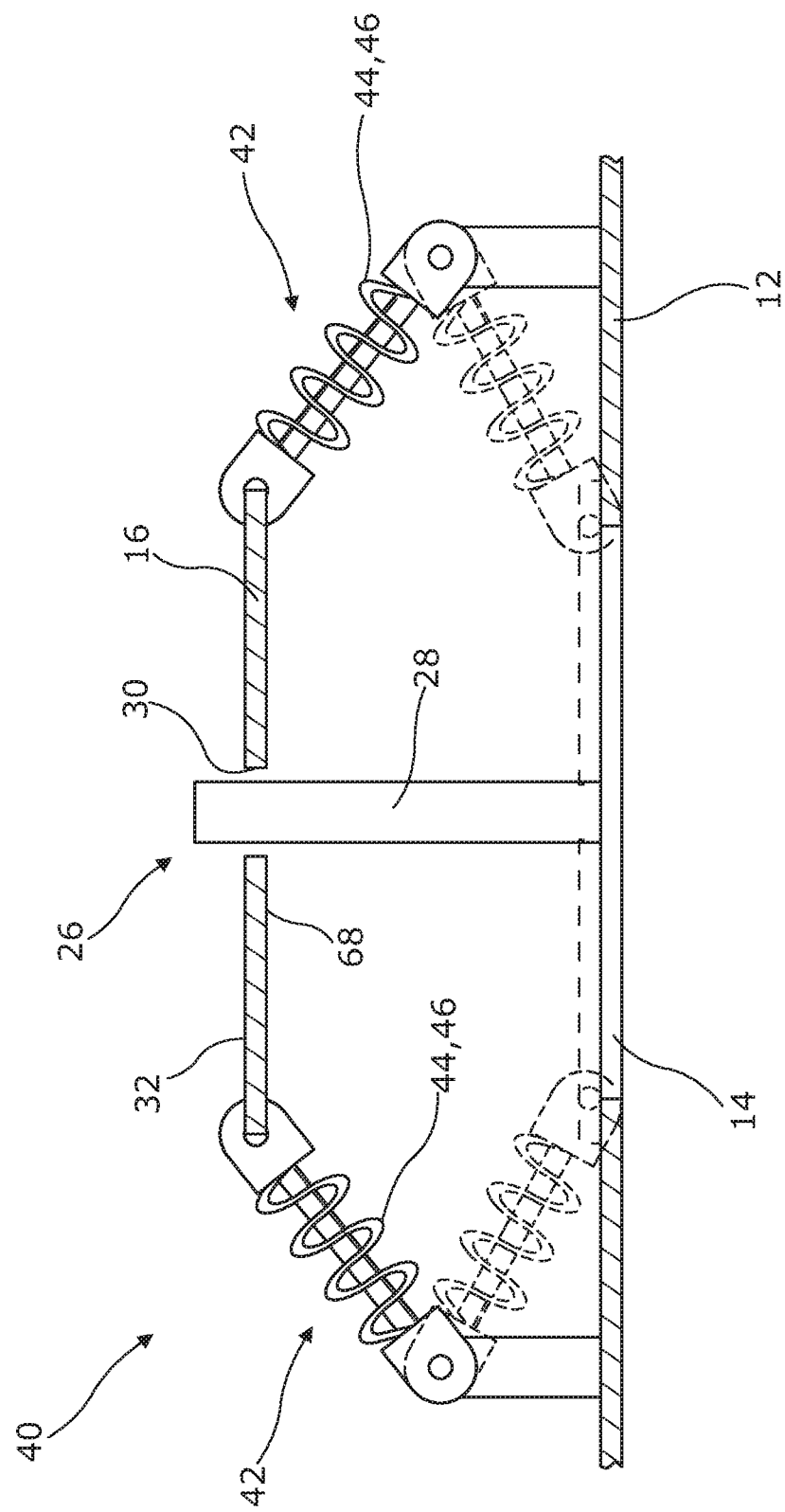
FIG. 2 shows an elevational view from one side of a portion of a power semiconductor module.

A portion of a power semiconductor module 40 according to embodiments of the invention is shown schematically in FIG. 2.

The second power semiconductor module 40 includes similar features to the first power semiconductor module 10 and these share the same reference numerals.

The second power semiconductor module 40 differs from the first power semiconductor module 10 in that the vent cover 16 is held in its open position within the housing 12, i.e. as shown in solid line in FIG. 2, by four double-acting support members 42 (only two of which are shown). Each double-acting support member 42 includes a bistable biasing member 44 in the form of a bistable compression spring 46, although other forms of double-acting support member and bistable biasing member are also possible.

During normal use of the second power semiconductor module 40 the double-acting support members 42, i.e. the bistable compression springs 46, urge the vent cover 16 into its open position. Thus the vent aperture 14 is open and ventilation is provided to the interior of the housing 12 of the said second power semiconductor module 40.

In the event of an explosion inside the housing 12 and the resulting increase in internal pressure within the housing, the vent cover 16 is urged into its closed position (as shown in dashed line in FIG. 2) by a net outward force upon the inward facing side 32 of the vent cover 16 resulting from the internal pressure acting upon the said inward facing side 32 of the vent cover 16 exceeding an external pressure acting upon an outward facing side 68 of the vent cover 16. With the vent cover 16 in its closed position the vent aperture 14 is closed and explosion gasses and debris are inhibited from passing through the vent aperture 14.

Movement of the vent cover 16 into its closed position causes each bistable compression spring 46 to pass through its over-centre position so that thereafter each urges the vent cover 16 into its closed position. Consequently the vent cover 16 remains in its closed position once the increase in pressure has subsided, i.e. once the explosive event is over.

Thereafter a maintenance operative may reset the second power semiconductor module 40 by moving the vent cover 16 back into its open position. This, in turn, causes each bistable compression spring 46 to pass back through its over-centre position whereby it again urges the vent cover 16 into its open position.

Figure 3A:
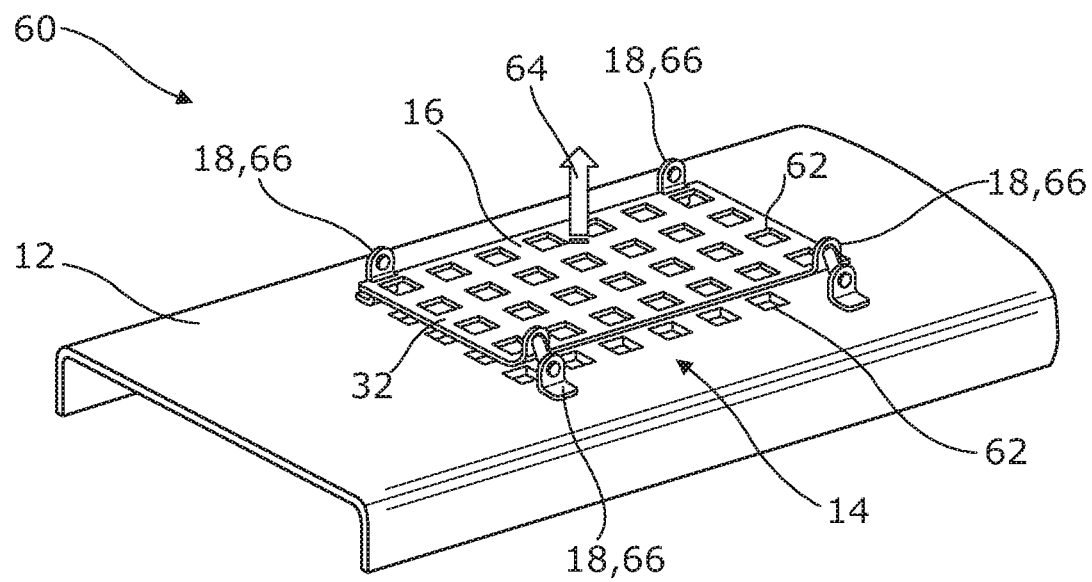
FIG. 3A shows a perspective view of a portion of a power semiconductor module during normal operation of the power semiconductor module.
Figure 3B:
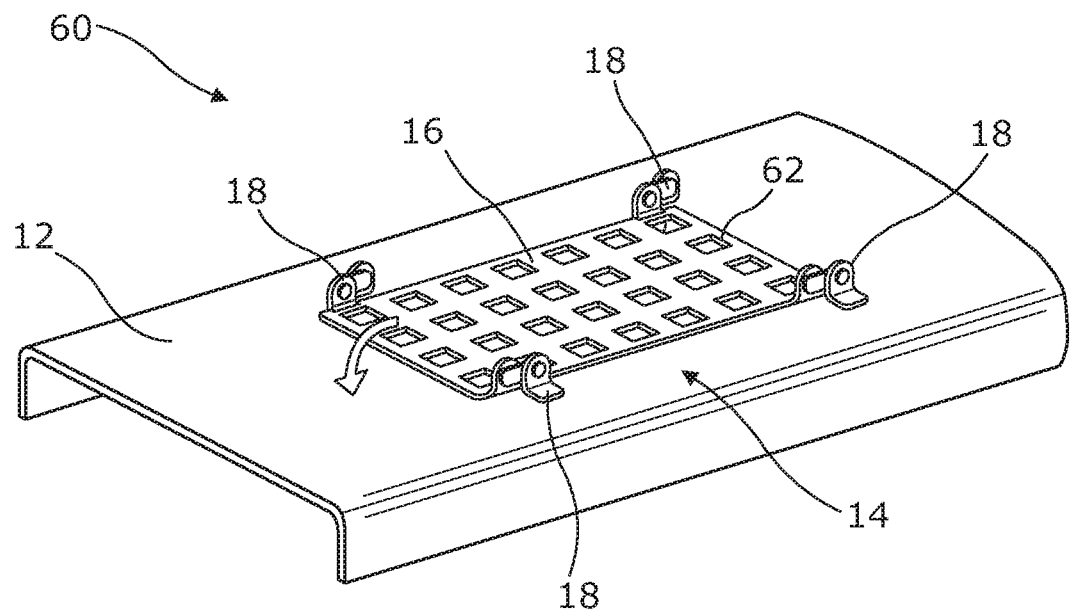
FIG. 3B shows a perspective view of the portion of power semiconductor module shown in FIG. 3A after an explosive event.

A power semiconductor module according to a third embodiment is designated generally by the reference numeral 60, and a portion is shown schematically in FIGS. 3A and 3B.

The third power semiconductor module 60 is again similar to each of the first and second power semiconductor modules 10; 40 and like features share the same reference numerals.

The third power semiconductor module 60 differs, however, from each of the first and second power semiconductor modules 10; 40 firstly in that both its vent aperture 14 and its vent cover 16 includes a plurality of individual ventilation openings 62.

The individual ventilation openings 62 in the vent cover 16 lie coincident with, i.e. are completely congruent with, the ventilation openings 62 in the vent aperture 14 when the vent cover 16 is in its open position, i.e. as shown in FIG. 3A, such that the respective ventilation openings 62 together define a plurality of ventilation paths 64.

Conversely, when the vent cover 16 is in its closed position, i.e. as shown in FIG. 3B, the ventilation openings 62 in the vent cover 16 are displaced from, i.e. do not line up with, the ventilation openings 62 in the vent aperture 14, such that all of the ventilation openings 62 in the vent aperture 14 are occluded by corresponding closed portions of the vent cover 16.

In addition, the third power semiconductor module 60 differs from the other power semiconductor modules 10; 40 of embodiments of the invention in that the vent cover 16 is held in its open position by four single-use support members 18, each of which instead includes a pair of mutually cooperable members 66 in the form of a detent formation and corresponding recess formation (not shown). Each corresponding detent formation and recess formation engage with one another to selectively inhibit relative movement between the vent cover 16 and housing 12 and thereby hold the vent cover 16 in its open position.

In other embodiments of the invention the mutually cooperable members could instead include first and second formations which ordinarily remain stationary relative to one another (so as to hold the vent cover in its open position) by virtue of there being a calibrated degree of friction therebetween. Such other mutually cooperable members could, for example, be first and second hinge leaves or one or more frictionally engaged guide pins and associated guide openings.

During normal use of the third power semiconductor module 60 the aforesaid four sets of mutually cooperable members 66 act to hold the vent cover 16 in its open position within the housing 12, as shown in FIG. 3A, with the various ventilation openings 62 being aligned with one another to define a number of ventilation paths 64 to open the vent aperture 14.

If an explosive event occurs within the housing 12 of the third power semiconductor module 60 the vent cover 16 is dislodged from its open position, i.e. the respective detent and recess formations are moved out of engagement with one another and so take no further part in holding the vent cover 16 in its open position. The vent cover 16 therefore moves under the influence of a net outward force upon the inward facing side 32 of the vent cover 16 resulting from the internal pressure acting upon the said inward facing side 32 of the vent cover 16 exceeding an external pressure acting upon the outward facing side of the vent cover 16 into its closed position in which the various ventilation openings 62 in the vent aperture 14 are occluded, i.e. closed-off, by corresponding closed portions of the vent cover 16. Hence the escape of explosion gasses and other detritus form the housing 12 via the vent aperture 14 is inhibited.

A further embodiment of the invention (not shown) may include a second pair of mutually cooperable members in the form of a second detent formation and corresponding recess formation which act to hold the vent cover 16 in the closed position. In this manner, the first and second pairs of mutually cooperable members together define part of a double-acting support member.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A power semiconductor module comprising:
 a housing within which lies at least one semiconductor switching element, the housing including a vent aperture selectively openable and closeable by a cooperating vent cover, wherein the vent cover is substantially coplanar with the housing,
 the vent cover being held in an open position by at least one collapsible leg during normal operation of the power semiconductor module to open the vent aperture and provide ventilation for the at least one semiconductor switching element within the housing, wherein the vent cover is substantially coplanar with the housing when the vent cover is in the open position;
 and the vent cover being urged along a guide pin into a closed position by an increase in pressure within the housing resulting from an explosive event inside the housing to collapse the at least collapsible leg closing the venture aperture and inhibiting the escape of explosion gases and debris from the housing via the vent aperture, wherein the vent cover is substantially coplanar with the housing when the vent cover is in the closed position.

2. The power semiconductor module according to claim 1, wherein the vent cover is configured to return to the open position once the increase in pressure has subsided.

3. The power semiconductor module according to claim 2, wherein the vent cover is held in the open position by one of:
  a biasing member; and
  gravity.

4. The power semiconductor module according to claim 1, wherein the vent cover is configured to remain in the closed position once the increase in pressure has subsided.

5. The power semiconductor module according to claim 4, wherein the vent cover is held in the open position by one or more of:
  a single-use support member; and
  a double-acting support member.

6. The power semiconductor module according to claim 5, wherein at least one of the single-use support members is one of:
  a collapsible member;
  a frangible member;
  a friable member; and
  a pair of mutually cooperable members selectively moveable relative to one another.

7. The power semiconductor module according to claim 5, wherein the double-acting support member is a bistable biasing member.

8. The power semiconductor module according to claim 1, wherein each of the vent aperture and the vent cover includes a plurality of individual ventilation openings, the ventilation openings in the vent cover being coincident with the ventilation openings in the vent aperture when the vent cover is in the open position to define a plurality of ventilation paths, and the ventilation openings in the vent cover being displaced from the ventilation openings in the vent aperture when the vent cover is in the closed position to occlude the said ventilation openings in the vent aperture.

9. The power semiconductor module according to claim 1, wherein at least one of the vent aperture and the vent cover includes a respective receiving portion corresponding to a support member which during normal operation of the power semiconductor module holds the vent cover in the open position, the respective receiving portion and housing receiving the support member when the vent cover is in the closed position.

10. A power semiconductor module comprising:
  a housing within which lies at least one semiconductor switching element, the housing including a vent aperture selectively openable and closeable by a cooperating vent cover,
  the vent cover being held in an open position by at least one collapsible leg during normal operation of the power semiconductor module to open the vent aperture and provide ventilation for the at least one semiconductor switching element within the housing,
  and the vent cover being urged along a guide pin into a closed position by an increase in pressure within the housing resulting from an explosive event inside the housing to collapse the at least collapsible leg closing the venture aperture and inhibiting the escape of explosion gases and debris from the housing via the vent aperture,
  wherein each of the vent aperture and the vent cover includes a plurality of individual ventilation openings, the ventilation openings in the vent cover being coincident with the ventilation openings in the vent aperture when the vent cover is in the open position to define a plurality of ventilation paths, and the ventilation openings in the vent cover being displaced from the ventilation openings in the vent aperture when the vent cover is in the closed position to occlude the said ventilation openings in the vent aperture.

* * * * *